United States Patent
Suzuki et al.

(10) Patent No.: US 10,297,463 B2
(45) Date of Patent: May 21, 2019

(54) METHOD FOR MANUFACTURING SILICON WAFER

(71) Applicant: SHIN-ETSU HANDOTAI CO., LTD., Tokyo (JP)

(72) Inventors: Katsuyoshi Suzuki, Takasaki (JP); Hiroshi Takeno, Annaka (JP); Koji Ebara, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/544,359

(22) PCT Filed: Jan. 7, 2016

(86) PCT No.: PCT/JP2016/000050
§ 371 (c)(1),
(2) Date: Jul. 18, 2017

(87) PCT Pub. No.: WO2016/132661
PCT Pub. Date: Aug. 25, 2016

(65) Prior Publication Data
US 2018/0247830 A1     Aug. 30, 2018

(30) Foreign Application Priority Data
Feb. 19, 2015   (JP) ................. 2015-030213

(51) Int. Cl.
*H01L 21/322*   (2006.01)
*C30B 29/06*   (2006.01)
(Continued)

(52) U.S. Cl.
CPC .......... *H01L 21/3225* (2013.01); *C30B 15/00* (2013.01); *C30B 29/06* (2013.01);
(Continued)

(58) Field of Classification Search
CPC ............... H01L 21/268; H01L 21/3225; H01L 21/76229
See application file for complete search history.

(56) References Cited

U.S. PATENT DOCUMENTS

| | | | |
|---|---|---|---|
| 6,485,807 B1 | 11/2002 | Park | |
| 2006/0075957 A1* | 4/2006 | Takeno | C30B 29/06 117/84 |

(Continued)

FOREIGN PATENT DOCUMENTS

| | | |
|---|---|---|
| JP | 2001-503009 A | 3/2001 |
| JP | 2001-203210 A | 7/2001 |

(Continued)

OTHER PUBLICATIONS

Aug. 22, 2017 International Preliminary Report on Patentablity issued in International Patent Application No. PCT/JP2016/000050.

(Continued)

*Primary Examiner* — Kyoung Lee
*Assistant Examiner* — Christina A Sylvia
(74) *Attorney, Agent, or Firm* — Oliff PLC (57) ABSTRACT

A method for manufacturing a silicon wafer having a denuded zone in a surface layer by performing a heat treatment to a silicon wafer, including: a step A, performing a first rapid heat treatment of 0.01 msec or more and 100 msec or less to an upper surface layer alone of the silicon wafer to be treated at 1300° C. or more and a silicon melting point or less by using a first heat source which heats the silicon wafer to be treated from above; and a step B, holding the silicon wafer to be treated at 1100° C. or more and less than 1300° C. for one second or more and 100 seconds or less by a second rapid heat treatment using a second heat source which heats the silicon wafer to be heated, and (Continued)

decreasing the temperature at a falling rate of 30° C./sec or more and 150° C./sec or less.

7 Claims, 3 Drawing Sheets

(51) Int. Cl.
    *C30B 33/12*     (2006.01)
    *H01L 21/26*     (2006.01)
    *C30B 15/00*     (2006.01)
    *C30B 33/02*     (2006.01)

(52) U.S. Cl.
    CPC .............. *C30B 33/02* (2013.01); *C30B 33/12* (2013.01); *H01L 21/26* (2013.01); *H01L 21/322* (2013.01)

(56) References Cited

U.S. PATENT DOCUMENTS

| | | | |
|---|---|---|---|
| 2008/0292523 A1* | 11/2008 | Ono | C30B 15/206 423/348 |
| 2009/0242843 A1* | 10/2009 | Ebara | C30B 29/06 252/500 |
| 2010/0105191 A1 | 4/2010 | Hayamizu et al. | |
| 2012/0001301 A1 | 1/2012 | Ebara et al. | |
| 2012/0043644 A1 | 2/2012 | Ono et al. | |
| 2013/0093060 A1 | 4/2013 | Oka et al. | |
| 2013/0316139 A1 | 11/2013 | Oka et al. | |

FOREIGN PATENT DOCUMENTS

| | | |
|---|---|---|
| JP | 2001-517871 A | 10/2001 |
| JP | 2003-297839 A | 10/2003 |
| JP | 2008-028355 A | 2/2008 |
| JP | 2008-294256 A | 12/2008 |
| JP | 2010-251471 A | 11/2010 |
| JP | 2012-023182 A | 2/2012 |
| JP | 2012-175023 A | 9/2012 |
| WO | 9845507 A1 | 10/1998 |
| WO | 9916119 A1 | 4/1999 |

OTHER PUBLICATIONS

Oct. 30, 2017 Office Action issued in Taiwanese Patent Application No. 105100715.

Apr. 12, 2016 International Search Report issued in International Patent Application No. PCT/JP2016/000050.

\* cited by examiner

METHOD FOR MANUFACTURING SILICON WAFER

TECHNICAL FIELD

The present invention relates to a method for manufacturing a silicon single crystal wafer which provides high dielectric breakdown strength of an oxide film and enables highly densely forming oxide precipitates in the wafer.

BACKGROUND ART

A silicon single crystal wafer (which will be also referred to as a silicon wafer hereinafter) which can be a material of a semiconductor device can be generally fabricated by growing a silicon single crystal by a Czochralski method (which will be also referred to as a CZ method hereinafter) and performing a machining process such as cutting or polishing to the obtained silicon single crystal.

In the silicon single crystal grown by the CZ method in this manner, oxidation induced stacking faults called OSFs (Oxidation induced Stacking Faults), which are annularly produced when the silicon single crystal is subjected to a thermal oxidation treatment (for example, 1100° C. for 2 hours), may be generated. It has been revealed that there are also microdefects (which will be referred to as grown-in defects hereinafter) which are formed other than OSFs during crystal growth and adversely affect device performance.

Thus, a method for manufacturing a single crystal to provide a wafer in which these defects are reduced as much as possible has been disclosed in recent years (see, e.g., Patent Literature 1).

Figure 4:
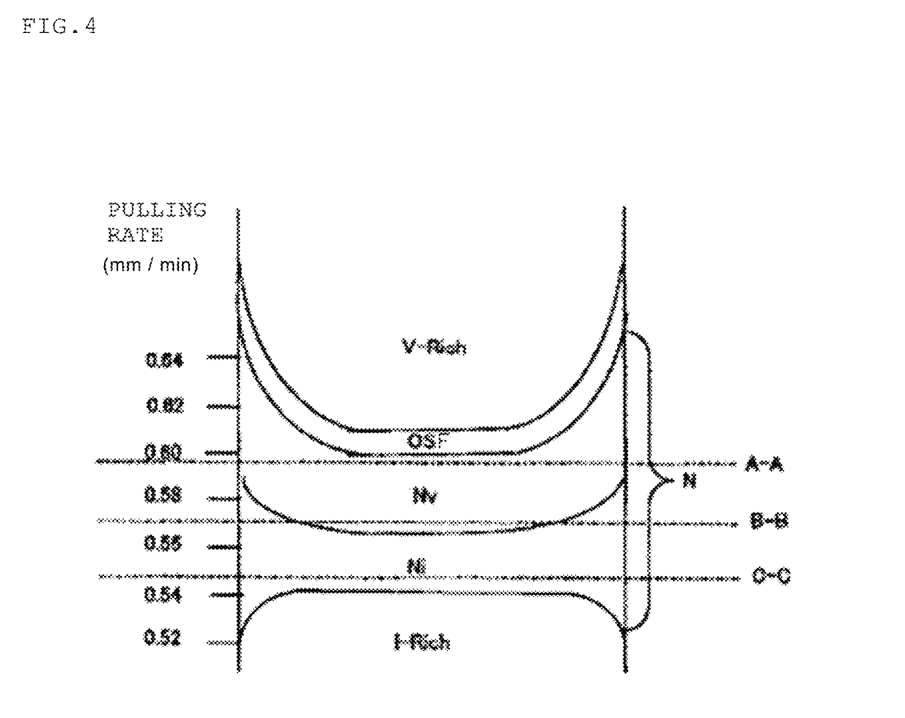
FIG. 4 is an explanatory drawing for explaining how crystal defects change relative to a pulling rate.

FIG. 4 shows a relationship between a pulling rate and a defect generation distribution when V/G is changed and a single crystal is grown where the pulling rate at the time of single-crystal growth using a method disclosed in Patent Literature 1 is V (ram/min) and an average value of a crystalline temperature gradient in a pulling axis direction in a temperature range from a silicon melting point to 1350° C. is G (° C./mm).

It is generally known that a temperature distribution G in a single crystal is dependent on a structure in a CZ furnace (which will be referred to as a hot zone hereinafter) and this distribution hardly varies even if a pulling rate is changed. Thus, in case of the CZ furnaces having the same structure, V/G corresponds to a change in puling rate only. That is, V and V/G have a relationship of a direct proportion. Thus, the pulling rate V is used for a vertical axis in FIG. 4.

In a region where V is relatively high, vacancy type grown-in defects called COPs (Crystal Originated Particles) or FPDs (Flow Pattern Defects), which are provided by agglomerating vacancy type point detects called vacancies (which will be referred to as Va hereinafter), are present in an entire crystal radial region, and this region is called a V-Rich region.

Further, when V is slightly lowered, the OSFs are annularly produced from a periphery of a crystal, and the OSFs shrink toward a center as V is decreased, and eventually the OSFs are annihilated at the crystal center.

When V is further lowered, a neutral (which will be referred to as N hereinafter) region where excess or deficiency of Va or interstitial point defects called interstitial silicon (which will be referred to as I hereinafter) is less is present. It has been revealed that, in this N region, concentration of Va or I is biased, but its concentration is equal to or less than saturated concentration, no defect is present or presence of a defect cannot be recognized by a current defect detecting method. This N region is classified into an Nv region where Va is dominant or an Ni region where I is dominant.

When V is further lowered, I is supersaturated, and defects of L/D (Large Dislocation: an abbreviation of an interstitial dislocation loop, LSEPD, LEPD, or the like) which can be considered as a dislocation loop which is an agglomeration of I are present at low density, and this region is called an I-Rich region.

When the grown-in defects which are present in the V-Rich region, the OSF region and the I-Rich region appear on a wafer surface, they adversely affect device characteristics, for example, they decrease dielectric breakdown strength of an oxide film in a case where an MOS (Metal Oxide Semiconductor) structure of a device is formed, and hence it is desired that such defects are not present in a wafer surface layer.

Meanwhile, oxygen of approximately $7 \times 10^{17}$ to $10 \times 10^{17}$ atoms/cm$^3$ (a conversion factor provided by Japan Electronics and Information Technology Industries Association: JEITA is used) is usually contained in a silicon wafer in a supersaturated state. Thus, a large amount of grown-in oxide precipitate nuclei is present in the silicon wafer, and supersaturated oxygen in the silicon wafer is precipitated as oxide precipitates or grown-in oxide precipitate nuclei are grown and actualized when a heat treatment is performed in a device process or the like. Such an oxide precipitate is called a BMD (Bulk Micro Defect).

It is known that, when this BMD is present in a bulk other than a device active region, it is effective since it functions as a gettering site to capture a metal impurity mixed during the device process, but it adversely affects the device characteristics such as junction leakage when it is produced on a silicon wafer surface which is the device active region. Thus, in manufacture of the silicon wafer, the BMDs must be formed in a wafer bulk, and a wafer having a denuded zone (which will be also referred to as a DZ layer hereinafter) where the BMDs or the grown-in defects are not present near a wafer surface which is the device active region is demanded.

In response to these demands in recent years, Patent Literature 1 suggests a method for performing an RTA treatment (Rapid Thermal Annealing: rapid heating/rapid cooling heat treatment) to a silicon wafer which is sliced out from a single crystal of an N region where an agglomerate of Va or I is not present and whose entire plane is the N region. It is to be noted that the RTA treatment is also referred to as an RTP treatment (Rapid Thermal Process). This RTA treatment is a heat treatment method characterized in that a temperature of a silicon wafer is rapidly raised from a room temperature at a temperature raising rate, e.g., 50° C./sec in a nitride forming atmosphere of, e.g., $N_2$ or $NH_3$ or in a mixed gas atmosphere of such a gas and a nitride non-forming atmosphere of, e.g., $A_r$ or $H_2$, the silicon wafer is heated and maintained at a temperature of approximately 1200° C. for tens of seconds, and then the temperature of the silicon wafer is rapidly decreased at a temperature falling rate of, e.g., 50° C./sec.

A mechanism of forming the BMD by performing an oxygen precipitation heat treatment after the RTA treatment is described in Patent Literature 1 or Patent Literature 2 in detail.

Here, the BMD formation mechanism will now be briefly described.

First, in the RTA treatment, Va is implanted from a wafer surface while maintaining a high temperature which is, e.g., 1200° C. in an N₂ atmosphere, and redistribution and annihilation with I occur due to diffusion of Va during cooling in a temperature range of 1200° C. to 700° C. at a temperature falling rate of, e.g., 5° C./sec. Consequently, Va is non-uniformly distributed in a bulk.

When a wafer in such a state is subjected to a heat treatment at, e.g., 800° C., oxygen is precipitously clustered in a region with high Va concentration, but the oxygen is not clustered in a region with low Va concentration.

In this state, subsequently, a heat treatment is performed at, e.g., 1000° C. for a fixed time, the clustered oxygen grows, and the BMDs are formed. As described above, when the oxygen precipitation heat treatment is performed to the silicon wafer subjected to the RTA treatment, the BMDs having a distribution in a wafer depth direction are formed in accordance with a Va concentration profile formed by the RTA treatment.

Thus, the desired Va concentration profile is formed in the silicon wafer by performing the RTA treatment while controlling conditions such as an atmosphere, a maximum temperature, a retention time, and others, and the oxygen precipitation heat treatment is performed to the thus obtained silicon wafer, thereby manufacturing a silicon wafer having a desired BMD profile in a depth direction.

Further, Patent Literature 3 discloses that an oxide film is formed on a surface when the RTA treatment is performed in an oxygen gas atmosphere, I is implanted from an oxide film interface, and hence BMD formation is suppressed. In this manner, the RTA treatment can promote the BMD formation or, contrarily, can suppress the same depending on conditions such as an atmospheric gas, a maximum retention temperature, and others. Since such an RTA treatment is an annealing performed in a very short time, outward diffusion of the oxygen hardly occurs, and a decrease in oxygen concentration in a surface layer can be ignored.

In case of Patent Literature 1, since no grown-in defect is present in the silicon wafer which can be a material, it seems that no problem occurs even if the RTA treatment is performed. However, when a TDDB (Time Dependent Dielectric Breakdown) characteristic which is an aged breakdown characteristic representing long-term reliability of an oxide film is measured after a silicon wafer whose entire plane consists of an N region is prepared and the RTA treatment is performed, in an Nv region of the silicon wafer, a TZDB (Time Zero Dielectric Breakdown) characteristic which is one of oxide film reliabilities is hardly lowered, but there is a flaw that the TDDB characteristic is lowered.

Furthermore, Patent Literature 4 suggests a method of performing a high-temperature RTA treatment of 1300° C. or more to a silicon wafer whose entire plane consists of an N region. According to this method, a large-sized oxide precipitate which can be a factor of degradation of the TDDB characteristic can be dissolved since the temperature is high, and the excellent TDDB characteristic can be provided. Moreover, it is possible to manufacture a silicon wafer having a BMD profile based on diffusion of Va. However, since a difference in temperature between a pin which supports a wafer in an RTA treatment apparatus and the silicon wafer is considerable, strong stress is produced in a section around the pin, and there is a flaw that slip dislocations are generated.

Additionally, Patent Literature 5 discloses another method for forming a DZ layer in a surface layer. This is a method for applying light pulses from a wafer front surface for approximately one to five seconds to heat the surface to approximately 1000° C., fixing a wafer back surface to a heat sink, maintaining it at a temperature less than 900° C. to decrease a temperature distribution from the wafer front surface toward the back surface, and thereby forming the DZ layer in the vicinity of the front surface. However, according to such a method, since the back surface of the wafer must be brought into contact with the heat sink, there is a problem that a contact portion is apt to be damaged or contaminated and contamination possibly spreads from a member of the heat sink.

CITATION LIST

Patent Literature

Patent Literature 1: Japanese Unexamined Patent Publication (Kokai) No. 2001-203210
Patent Literature 2: Japanese Translation of PCT International Application Publication No. 2001-503009
Patent Literature 3: Japanese Unexamined Patent Publication (Kokai) No. 2003-297839
Patent Literature 4: Japanese Unexamined Patent Publication (Kokai) No. 2012-175023
Patent Literature 5: Japanese Translation of PCT International Application Publication No. 2001-517871

DISCLOSURE OF INVENTION

Problem to be Solved by the Invention

In view of the problems, it is an object of the present invention to provide a method for manufacturing a silicon wafer by which BMDs are highly densely formed in a bulk region of a wafer by an oxygen precipitation heat treatment or the like to provide a high gettering characteristic and, at the same time, grown-in defects or oxide precipitate nuclei formed on a single-crystal growing stage are annihilated in a wafer surface layer alone to enable manufacture of a silicon single crystal wafer having an excellent TDDB characteristic.

Means for Solving Problem

To achieve the object, the present invention provides a method for manufacturing a silicon wafer which has a denuded zone in a surface layer by performing a heat treatment to a silicon wafer to be treated, the method comprising:

a step A of performing a first rapid heat treatment of 0.01 msec or more and 100 msec or less to an upper surface layer alone of the silicon wafer to be treated at a temperature of 1300° C. or more and a silicon melting point or less by using a first heat source which heats the silicon wafer to be treated from above; and a step B of holding the silicon wafer to be treated at a temperature which is 1100° C. or more and less than 1300° C. for one second or more and 100 seconds or less by a second rapid heat treatment using a second heat source which heats the silicon wafer to be heated, and decreasing the temperature at a temperature falling rate of 30° C./sec or more and 150° C./sec or less.

According to such a manufacturing method, grown-in defects and oxide precipitate nuclei in the surface layer alone can be dissolved by the step A using the first heat source to realize the excellent TDDB characteristic and, at the same time, vacancies can be frozen in a bulk by the step B using the second heat source. Thus, BMDs can be highly densely formed in a bulk region by an oxygen precipitation heat treatment or the like.

Further, it is possible that the step A is performed during the step B, and the silicon wafer to be treated is heated from below by the second heat source in the step B.

According to such a manufacturing method, the number of apparatus used for the rapid heat treatments of the wafer can be one, which is convenient. Furthermore, since the step A is performed while the wafer is heated and maintained at the step B, the surface layer can be further assuredly heated to 1300° C. or more at the step A.

On the other hand, it is possible that the step A and the step B are separately performed.

According to such a manufacturing method, it is possible to change a heating atmosphere depending on the step A and the step B.

Moreover, it is preferable that a xenon lamp is used as the first heat source.

When such a heat source is used as the first heat source, heating can be easily and rapidly performed to reach a high temperature of 1300° C. or more, and the wafer surface layer can be uniformly heated in a radial direction.

Additionally, it is preferable that a halogen lamp is used as the second heat source.

When such a heat source is used as the second heat source, a second rapid heat treatment can be easily performed.

Further, it is preferable that the silicon wafer to be treated is sliced out from a silicon single crystal ingot which is grown by a Czochralski method and has oxygen concentration of 7 ppma or more and 20 ppma or less.

According to such a silicon wafer to be treated, the oxide precipitate nuclei in the surface layer can be more assuredly annihilated because there is no excessive amount or size of the oxide precipitate nuclei. Furthermore, it is possible to effectively prevent oxygen from being easily reprecipitated by the heat treatment in the device process after forming a DZ layer by the first rapid heat treatment and the second rapid heat treatment. Therefore, it is prevented that the BMDs are newly produced in the DZ layer formed in advance. On the other hand, in the bulk region, the oxide precipitate nuclei can be sufficiently grown to form the BMDs having a gettering function.

Furthermore, it is preferable that the silicon wafer to be treated is sliced out from a silicon single crystal ingot which is grown by a Czochralski method and has nitrogen concentration of $1 \times 10^{11}$ to $1 \times 10^{15}$ atoms/cm$^3$.

According to such a silicon wafer to be treated, a size of the grown-in defects can be reduced, and hence defects in the surface layer region can be further assuredly annihilated as compared with a case where nitrogen doping is not performed, thereby providing high dielectric breakdown strength of the oxide film. Moreover, since the nitrogen is contained, wafer strength is increased, and generation of slip dislocations during the heat treatment can be preferably avoided. Additionally, since formation of the BMDs is promoted, a control range over the BMDs can be increased.

Further, it is preferable that the silicon wafer to be treated is sliced out from a silicon single crystal ingot which is grown by a Czochralski method and has carbon concentration of $1 \times 10^{16}$ to $1 \times 10^{17}$ atoms/cm$^3$.

According to such a silicon wafer to be treated, after the first rapid heat treatment which is a heat treatment for the surface layer only and the second rapid heat treatment, the BMDs can be further easily formed in the bulk region by the heat treatments in the device process, and a device having a higher gettering capability can be formed. Furthermore, generation of slip dislocations can be effectively inhibited.

Moreover, it is preferable that the silicon wafer to be treated is sliced out from a silicon single crystal ingot which is grown by a Czochralski method and whose entire plane in a radial direction is an N region.

In such a silicon wafer, the grown-in defects such as COPs or OSF nuclei are not present, but the oxide precipitate nuclei, which can be annihilated at lower temperatures in a shorter time than the grown-in defects can be annihilated, are solely present, and hence the excellent TDDB characteristic can be provided.

Effect of the Invention

According to the method for manufacturing a silicon wafer of the present invention, it is possible to manufacture a silicon single crystal wafer which has high dielectric breakdown strength of an oxide film and in which the BMDs can be highly densely formed in its bulk by the oxygen precipitation heat treatment or the like. Additionally, in the present invention, as different from, e.g., the conventional method, a back surface does not have to be brought into contact with the heat sink, and higher device characteristics can be provided with less contamination or damage.

BEST MODE(S) FOR CARRYING OUT THE INVENTION

The present invention will now be described hereinafter in detail.

As described above, in manufacture of a silicon wafer, BMDs which turn to gettering sites must be formed in a bulk region of the wafer, and dielectric breakdown strength of an oxide film must be increased.

To provide a silicon wafer which has excellent dielectric breakdown strength of an oxide film and high BMD density, as a conventional method, there is, e.g., a method based on a high-temperature RTA treatment. For example, there can be considered a method for performing the high-temperature RTA treatment of 1300° C. or more based on the method disclosed in Patent Literature 4. In case of this method, since large-sized oxide precipitates which can cause degradation of the dielectric breakdown strength of the oxide film can be dissolved, the excellent dielectric breakdown strength of the oxide film can be provided. Further, implantation of Va enables highly densely forming the BMDs.

However, as a result of earnest studies conducted by the present inventors, it has been discovered that the method disclosed in Patent Literature 4 may lead to generation of slip dislocations since a temperature of the RTA treatment is high. Further, as a result of the earnest studies, it has been revealed that the RTA treatment at 1200° C. or less does not lead to generation of slip dislocations but fails to provide the high dielectric breakdown strength of the oxide film.

As a result of repeatedly examining the problems, the present inventors have considered that these problems can be solved by performing two different types of rapid heat treatments, especially heating a surface layer and a bulk at different temperatures, and thereby bringing the present invention to completion.

Although the method for manufacturing a silicon wafer according to the present invention will now be described in detail hereinafter with reference to the drawings, the present invention is not restricted thereto.

Figure 1:
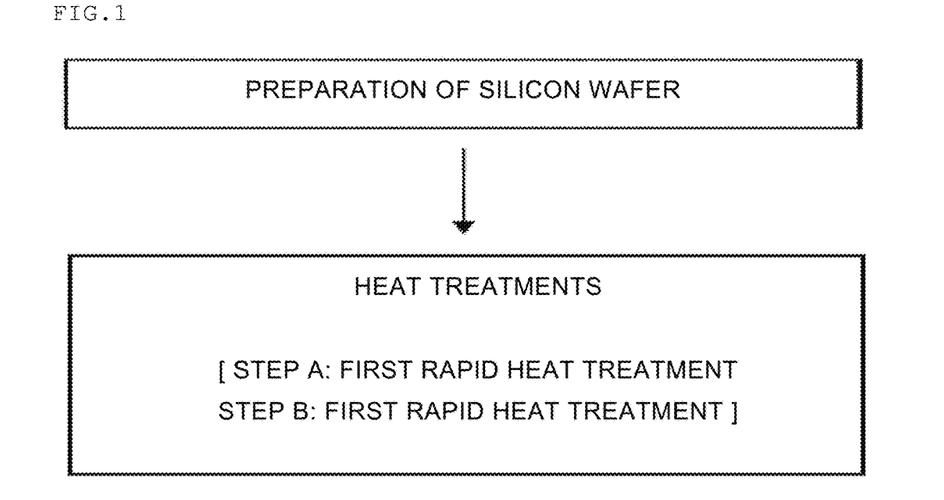
FIG. 1 is a flowchart showing an example of a procedure of a method for manufacturing a silicon wafer according to the present invention.

FIG. 1 is a flowchart showing an example of a procedure to implement the method for manufacturing a silicon wafer according to the present invention.

An overall flow of the implementing procedure will be first described. First, a silicon wafer to be treated is prepared. The silicon wafer prepared herein is not restricted in particular, but quality of a silicon wafer to be treated can be determined in advance so that the silicon wafer having the desired quality can be provided by the manufacturing method according to the present invention.

As described above, as a method for imparting desired quality (BMDs, grown-in defects, and the like) to the silicon wafer to be treated, there can be considered, e.g., adjusting each condition at the time of pulling a silicon single crystal ingot, which can be a base of the silicon wafer to be treated, by a Czochralski method.

Then, as shown in FIG. 1, a heat treatment is performed to the thus obtained silicon wafer to be treated so that a silicon wafer which has a denuded zone in a surface layer and can impart a gettering capability can be manufactured. According to the method for manufacturing a silicon wafer of the present invention, at least a step A and a step B described below are carried out. The step A is performing a first rapid heat treatment to a surface layer on an upper side alone of the silicon wafer to be treated at a temperature of 1300° C. or more and a silicon melting point or less at 0.01 msec or more and 100 msec or less by a first heat source which heats the silicon wafer to be treated from above. The step B is holding the silicon wafer to be treated at a temperature of 1100° C. or more and less than 1300° C. for one second or more and 100 seconds or less by a second rapid heat treatment using a second heat source which heats the silicon wafer to be treated, and then decreasing a temperature at a temperature falling rate of 30° C./sec or more and 150° C./sec or less. When the step A and the step B described above are carried out, the surface layer of the silicon wafer to be treated can be free from defects. Thus, according to the present invention, it is possible to manufacture a silicon wafer which has high dielectric breakdown strength of an oxide film and enables formation of BMDs at high density in a bulk.

The step A can be performed during the step B. For example, the step A can be performed during holding at the above temperature in the step B. By doing so, the surface layer can be assuredly heated to 1300° C. or more at the step A. In this case, at the step B, the silicon wafer to be treated is heated from below by using the second heat source.

Further, the step A and the step B can be separately performed. In this case, an order of the step A and the step B is not restricted in particular.

Here, examples of an apparatus which enables manufacturing a silicon single crystal from which the silicon wafer to be treated is sliced out and an apparatus which enables performing heat treatments to the silicon wafer to be treated will now be described, respectively.

Figure 2:
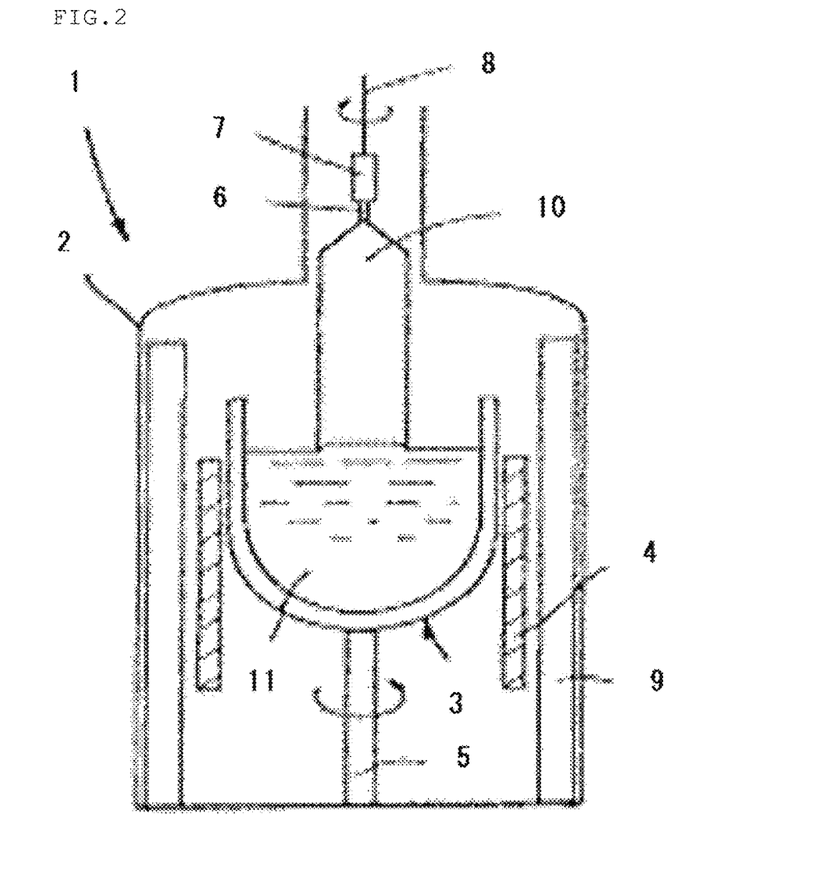
FIG. 2 is a schematic view showing an example of a single-crystal pulling apparatus which can be used in the method for manufacturing a silicon wafer according to the present invention.

FIG. 2 is a schematic view showing an example of a single-crystal pulling apparatus which can be used in the method for manufacturing a silicon wafer according to the present invention. At the time of pulling a silicon single crystal by the Czochralski method, for example, such a single-crystal pulling apparatus as shown in FIG. 2 can be used. As shown in FIG. 2, this single-crystal pulling apparatus 1 is constituted of a pulling chamber 2, a crucible 3 provided in the pulling chamber 2, a heater 4 arranged around the crucible 3, a crucible holding shaft 5 and its rotation mechanism (not shown) which rotate the crucible 3, a seed chuck 7 which holds a seed crystal 6 of silicon, a wire 8 which pulls the seed chuck 7, and a take-up mechanism (not shown) which rotates or takes up the wire 8. Furthermore, a heat insulting material 9 is arranged around a periphery of the heater 4. A silicon single crystal 10 is pulled from a silicon melt 11 which is a starting material by the wire 8.

Figure 3:
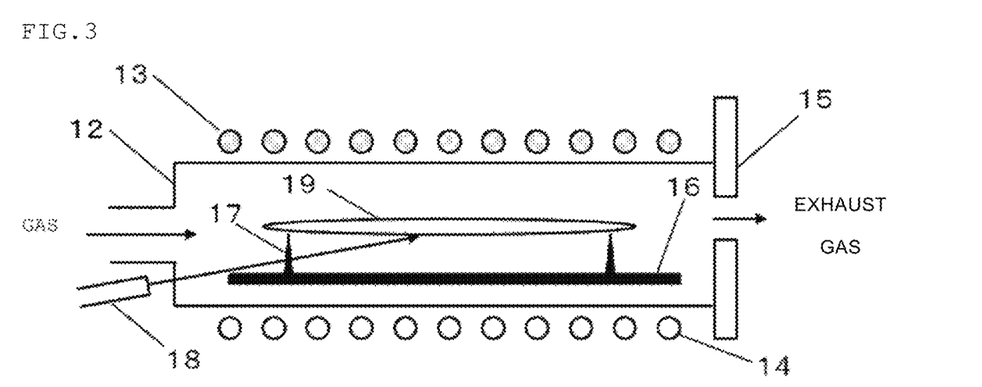
FIG. 3 is a schematic view showing an example of a heat treatment apparatus which can be used in the method for manufacturing a silicon wafer according to the present invention.

Next, the apparatus to perform heat treatments to the silicon wafer sliced out from the silicon single crystal 10 pulled by the single-crystal pulling apparatus 1 will now be described. FIG. 3 is a schematic view showing an example of a heat treatment apparatus which can be used in the method for manufacturing a silicon wafer according to the present invention. The heat treatment apparatus (which will be also referred to as an FLA apparatus hereinafter) shown in FIG. 3 has a chamber 12 made of quartz, and a silicon wafer 19 is thermally treated in this chamber 12.

Moreover, in the FLA apparatus shown in FIG. 3, the first rapid heat treatment is performed by using Xe flash lamps (xenon lamps) 13 arranged on a chamber upper portion. The second rapid heat treatment is performed by using halogen lamps 14 arranged on a chamber lower portion. In this case, the first rapid heat treatment is flash lamp annealing (FLA: a rapid temperature raising/falling heat treatment) performed in a very short time. Thus, the FLA apparatus shown in FIG. 3 can perform the FLA which is the first rapid heat treatment during the second rapid heat treatment (during high-temperature holding of the RTA in particular). It is to be noted that the first heat source, the second heat source, the first rapid heat treatment, and the second rapid heat treatment are not restricted thereto, and they can be separately performed.

A non-illustrated wafer insertion opening formed to be openable/closable by a gate valve is provided in an auto shutter 15. Further, the silicon wafer 19 is arranged on a support section 17 formed on a quartz tray 16. Furthermore, a non-illustrated temperature measurement special window is provided to the chamber 12, and a temperature of the silicon wafer 19 can be measured by a pyrometer 18 installed outside the chamber 12 through the special window. As described above, the single-crystal pulling apparatus and the heat treatment apparatus equal to counterparts in the conventional examples can be used, and their structures are not restricted in particular.

Each step in the flowchart in FIG. 1 will now be described in detail hereinafter. As described above, first, the silicon wafer to be treated is prepared. In the first rapid heat treatment in the manufacturing method according to the present invention, as will be described later, since the upper surface layer alone of this silicon wafer to be treated is heated to annihilate the grown-in defects, quality of the silicon wafer to be treated could be determined on a preparation stage so that the defects can be annihilated at low temperatures in a short time.

For example, at the time of pulling the silicon single crystal by using the single-crystal pulling apparatus 1 shown in FIG. 2, V/G can be adjusted by changing a pulling rate V (V/G may be adjusted by changing a hot zone to vary G) so that the single crystal to be pulled can be a single crystal whose entire plane in the radial direction is an N region. As a matter of course, an entire plane in the radial direction of a silicon wafer sliced out from this crystal is the N region, and no grown-in defect is present in this wafer.

Since oxide precipitate nuclei alone are present in this silicon wafer of the N region and they can be annihilated by a heat treatment at a relatively low temperature, a cost or a treatment time required for formation of the DZ layer can be further reduced. This is also effective for a decrease in contamination or suppression of generation of slip dislocations.

Here, it is preferable to set oxygen concentration in this silicon single crystal to 7 ppma or more and 20 ppma or less. When the oxygen concentration is 7 ppma or more in this manner, since the grown-in oxide precipitate nuclei are appropriately present in the single crystal or the silicon wafer sliced out therefrom, the oxide precipitate nuclei are grown by the heat treatment and the BMDs are formed in the device process, and the gettering function can be provided.

Further, since the oxygen concentration is 20 ppma or less, sizes of the grown-in defects or the oxide precipitate nuclei formed during crystal growth do not increase beyond necessity, and the oxide precipitate nuclei in the surface layer can be more assuredly annihilated. Furthermore, since an original degree of supersaturation of oxygen is not too high, annihilating the oxide precipitate nuclei in the surface layer by the first rapid heat treatment enables effectively preventing the oxygen from being again precipitated even if the heat treatment is performed in the device process, thereby avoiding appearance of BMDs on the surface.

As described above, it is preferable for the oxygen concentration to fall within the above range so that the new oxide precipitate nuclei are not formed by the regular device heat treatment. The oxygen concentration is more preferably set to 15 ppma or less.

Further, it is preferable for the silicon single crystal to have nitrogen concentration of $1 \times 10^{11}$ to $1 \times 10^{15}$ atoms/cm$^3$. When the nitrogen is contained at the concentration, the size of the grown-in defects can be reduced, and hence the defects in the surface layer can be assuredly annihilated as compared with a case where nitrogen doping is not performed, which is effective. Moreover, it is also known that formation of the BMDs is promoted or mechanical strength of a wafer is increased when the nitrogen is contained, there are advantages that generation of slip dislocations at the time of the heat treatment can be suppressed and a control range over the BMDs in the bulk can be enlarged.

Additionally, it is preferable for the silicon single crystal to have carbon concentration of $1 \times 10^{16}$ to $1 \times 10^{17}$ atoms/cm$^3$. It is known that the BMDs can be easily formed by the heat treatment in the device process when the carbon is contained at the concentration in this manner, which is advantageous. Further, the carbon functions as a catalyst when the oxygen fixes a dislocation such as a slip, thereby suppressing the slip dislocations.

It is to be noted that these concentrations can be adjusted by using a method equal to those in the conventional examples. For example, in case of the nitrogen concentration, a silicon wafer or the like doped with nitrogen by the Czochralski method can be put into a starting material in a crucible to adjust its concentration.

Furthermore, as described above, it is preferable for an entire plane in the radial direction of the silicon single crystal to be the N region. The grown-in defects, e.g., COPs or OSF nuclei are not present in a silicon wafer sliced out from such an N-region single crystal ingot, and the oxide precipitate nuclei alone, which can be annihilated at a lower temperature than the grown-in defects can be, are present. Thus, the present invention which makes the surface layer free from defects is effective for reducing costs of the heat treatment. Moreover, the treatment can be performed at lower temperatures, which is advantageous to a decrease in contamination or slip dislocations.

Slicing is carried out to the silicon single crystal pulled while adjusting the grown-in defects, the oxygen concentration, and others, and this sliced piece can be used as the silicon wafer to be treated.

Then, the heat treatments including the step A and the step B are performed to the thus provided silicon wafer to be treated. The steps A and B are rapid heat treatments. Although the rapid heat treatment conditions in the step A and the step B are as described above, they will be described in more detail hereinafter. When the step A is performed, the large-sized oxide precipitates which can cause degradation of the TDDB characteristics can be dissolved. At this time, since a heating time to reach 1300° C. or more is very short, an increase in temperature of a back surface side (a lower side of the wafer) is small, and generation of slip dislocations can be suppressed. When the step B is performed under the described conditions, vacancies can be frozen in a bulk of the wafer, thus providing high BMD density.

At this time, when an apparatus having the first heat source and an apparatus having the second heat source are prepared respectively, the step A and the step B can be separately performed. In this case, a heating atmosphere can be changed depending on the step A and the step B. Moreover, when an apparatus having the first heat source and the second heat source, e.g., an FLA apparatus shown in FIG. 3 is prepared, the step A can be carried out during the step B. In this case, the number of the apparatus used for manufacture of wafers can be one.

As the first heat source in this case, a laser annealing apparatus or the like can be used, but using a flash lamp having a rare gas such as a xenon sealed therein, especially an Xe flash lamp is preferable. In this case, heating can be readily carried out at a temperature of 1300° C. or more described later, and the entire plane of each wafer in the radial direction can be uniformly heated.

Additionally, as the second heat source, a halogen lamp can be used. Consequently, the second rapid heat treatment can be easily performed.

Here, a heating temperature (a maximum temperature in heating in particular) provided by the first heat source is set to 1300° C. or more and a melting point of silicon (1412° C.) or less. When the heating temperature of the first heat source is less than 1300° C., the grown-in defects and the oxide precipitate nuclei in the surface layer cannot be sufficiently dissolved. When the heating temperature of the first heat source exceeds the melting point of silicon, the silicon wafer to be treated may be possibly deformed.

Further, a heating time provided by the first heating source (a total irradiation time in the step A of the flash lamp annealing) is set to 0.01 msec or more and 100 msec or less. When the heating time of the first heat source is less than 0.01 msec, the grown-in defects and the oxide precipitate nuclei in the surface layer on a wafer upper side (a front side)

cannot be sufficiently dissolved. Furthermore, when the heating time of the first heat source exceeds 100 msec, slip dislocations may be possibly generated. It is preferable to set the heating time of the first heat source to 20 msec or less in particular to avoid an increase in temperature on the wafer back surface.

Moreover, a heating temperature provided by the second heat source is set to 1100° C. or more and less than 1300° C. When the heating temperature provided by the second heat source is less than 1100° C., Va cannot be implanted, and the BMD density cannot be higher than that before the heat treatment. Additionally, when the heating temperature provided by the second heat source is 1300° C. or more, slip dislocations are produced in a wafer. It is to be noted that setting the heating temperature of the second heat source to 1150° C. or more is particularly preferable to highly densely form the BMDs.

A heating time provided by the second heat source is set to one second or more and 100 seconds or less. When the heating time of the second heat source is less than one second, the oxide precipitate nuclei formed at an ingot pulling stage cannot be grown. When the heating time of the second heat source exceeds 100 seconds, productivity is lowered.

A temperature falling rate in the second rapid heat treatment is set to 30° C./sec or more and 150° C./sec or less. When the temperature falling rate at the time of rapidly decreasing a temperature is less than 30° C./sec, vacancies cannot be frozen in a wafer, and the BMDs cannot be highly densely formed. Further, when the temperature falling rate is higher than 150° C./sec, the slip dislocations may be produced by rapid cooling in some cases.

It is to be noted that a temperature raising rate in the second rapid heat treatment can be set to, e.g., 30° C./sec or more and 70° C./sec or less.

When the heat treatments are carried out under the conditions, it is possible to provide a wafer which has a TDDB good chip yield of, e.g., 90% or more and in which the BMDs can be highly densely formed by a device heat treatment or the like.

Additionally, the first rapid heat treatment and the second rapid heat treatment can be carried out in a non-oxidizing atmosphere of argon, hydrogen, helium, or a mixed gas of these materials. In case of performing the first rapid heat treatment (a heat treatment of a surface layer region) and the second rapid heat treatment in the non-oxidizing atmosphere in this manner, since equilibrium concentration of oxygen on the surface is lower than that of the oxidizing atmosphere, the oxygen can be efficiently outwardly diffused. Consequently, the oxygen concentration near the surface can be lowered and rapidly reach solid solubility limit or less, and hence the oxide precipitate nuclei or the grown-in defects can be more readily annihilated, thereby improving quality in the outermost surface layer in particular. Further, when the heat treatment atmosphere in the first rapid heat treatment and the second rapid heat treatment is hydrogen, its reducing action facilitates dissolving defects caused due to the oxide precipitates, and hence the quality of the surface can be further improved.

Furthermore, the first rapid heat treatment and the second rapid heat treatment can be performed in a nitride film forming atmosphere containing nitrogen and ammonia. In case of performing the first rapid heat treatment and the second rapid heat treatment in the nitride film forming atmosphere in this manner, as described in Patent Literature 2, it is known that vacancies can be efficiently implanted into a wafer and the implanted vacancies promote oxygen precipitation. The vacancy implantation promotes the oxygen precipitation in this manner and, at the same time, annihilation of the grown-in oxide precipitate nuclei during heating can be suppressed. That is, as compared with a case where heating is performed in an atmosphere which does not require the vacancy implantation rather than the nitride film forming atmosphere, a width of the DZ layer can be prevented from increasing beyond necessity and can be decreased. When the DZ layer is narrow and a bulk having the BMDs is close to a device region, a diffusion distance of metal impurities mixed during a device process to reach the BMDs as gettering sites is reduced, and the metal impurities can be efficiently gettered.

On the other hand, the first rapid heat treatment and the second rapid heat treatment can be carried out in an oxidizing atmosphere containing oxygen. In case of performing the first rapid heat treatment and the second rapid heat treatment in the oxidizing atmosphere in this manner, interstitial Si (I) is implanted, the oxide precipitate nuclei are apt to be easily dissolved, and hence the width of the DZ layer can be increased. Alternatively, the DZ layer can be formed by a heat treatment at a lower temperature/in a shorter time.

As described above, the method for manufacturing a silicon wafer according to the present invention enables providing a silicon wafer which cannot be provided by conventional methods, i.e., a silicon wafer which has the excellent TDDB characteristic and high BMD density in a bulk.

EXAMPLES

The present invention will now be more specifically described hereinafter with reference to an example and comparative examples, but the present invention is not restricted these examples.

A silicon wafer to be treated in which an Nv region and an Ni region are mixed was prepared, and Example and Comparative Examples 1 and 2 described below were carried out.

A conductivity type, a resistivity, oxygen concentration, a diameter, and a crystal axis orientation of the silicon wafer are follows.

Conductivity type: P type
Resistivity: 17 to 20 Ω·cm
Oxygen concentration: 13 to 14 ppma (JEITA)
Diameter: 300 mm
Crystal axis orientation: <100>
Doping of nitrogen and carbon was not performed.

Example

The manufacturing method according to the present invention was carried out by using the FLA apparatus shown in FIG. 3. It is to be noted that the step A was performed during the step B. Specifically, a temperature of a prepared wafer was rapidly raised (rapid temperature raising in the step B) from a room temperature to 1175° C. at a temperature raising rate of 50° C./sec provided by a halogen lamp in a mixed atmosphere containing 3% of $NH_3$ and 97% of Ar by using the FLA apparatus shown in FIG. 3 and held for 10 seconds to preliminary heat the wafer (holding in the step B), irradiation using an Xe flash lamp was performed for 2 msec in this state to solely heat a surface layer on an upper side of the silicon wafer to be treated to 1350° C. (the step A), and a temperature falling rate from the preliminary heating temperature to 700° C. or less was set to 50° C./sec to carry out rapid cooling (rapid temperature falling in the step B).

Comparative Example 1

Like Example, a wafer was prepared, its temperature was rapidly raised from a room temperature to 1175° C. at a temperature raising rate of 50° C./sec in a mixed atmosphere containing 3% of $NH_3$ and 97% of Ar by using a commercially available rapid heating/rapid cooling apparatus (an RTA apparatus) and held for 10 seconds, and then the wafer was rapidly cooled at a temperature falling rate of 50° C./sec.

Comparative Example 2

Like Example, a wafer was prepared, its temperature was rapidly raised from a room temperature to 1000° C. at a temperature raising rate of 30° C./sec provided by a halogen lamp in an atmosphere containing 100% of Ar by using the FLA apparatus shown in FIG. 3 and held for 20 seconds to preliminary heat the wafer, and irradiation using the Xe flash lamp was performed for 40 msec in this state to solely heat a surface layer on an upper side of the silicon wafer to be treated to 1300° C., and the wafer was rapidly cooled at a temperature falling rate of 30° C./sec from the preliminary heating temperature to 700° C. or less.

A gate oxide film having a thickness of 25 nm was formed on the wafer of each of Example and Comparative Examples 1 and 2, and then the TDDB characteristic was evaluated.

Figure 5:
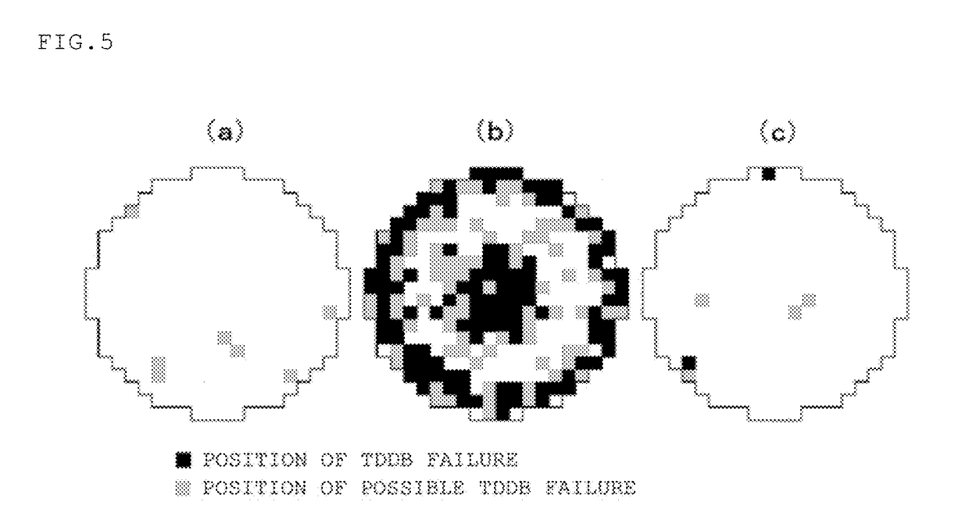
FIG. 5 shows measurement results of TDDB in Example and Comparative Examples 1 and 2, where (a) shows a measurement result of Example, (b) shows a measurement result of Comparative Example 1, and (c) shows a measurement result of Comparative Example 2.

FIG. 5 shows TDDB measurement results of Example and Comparative Examples 1 and 2. In FIG. 5, (a) shows a measurement result of Example, (b) shows that of Comparative Example 1, and (c) shows that of Comparative Example 2. Although a γ-mode good chip yield of 99% was acquired in each of Example and Comparative Example 2, a good chip yield of Comparative Example 1 was 69%. That is because a heating temperature of the wafer surface layer was low and hence large-sized oxide precipitates which degrade the TDDB characteristic were not successfully dissolved in Comparative Example 1, but the wafer surface layer was sufficiently heated to a high temperature in each of Example and Comparative Example 2, which resulted in successful dissolution of the oxide precipitates and no defect in the surface layer.

Slip dislocations in Example and Comparative Examples 1 and 2 were evaluated by an X-ray topography, temperatures on back surfaces were low in all examples, and hence no slip dislocation was confirmed.

Further, the wafers of Example and Comparative Examples 1 and 2 were thermally treated in an $N_2$ atmosphere at 800° C. for four hours. Then, temperatures of the wafers were raised to 1000° C. at a temperature raising rate of 10° C./min in the same heat treatment furnace, a heat treatment was performed at 1000° C. for 16 hours, thereafter the temperatures were decreased to 700° C., and the wafers were taken out. Subsequently, each wafer was attached to a jig having an angle of approximately 22°, and oblique polishing was performed. Then, preferential etching was performed to measure BMD density by using a microscope. Consequently, the BMDs were sufficiently formed at the density of $5\times10^9$ pieces/cm$^3$ in Example and Comparative Example 1. However, the same were formed at the density of $5\times10^8$ pieces/cm$^3$ in Comparative Example 2, and this BMD density was smaller than that of Example and Comparative Example 1. As a reason for this, it can be considered that the preliminary heating temperature in Comparative Example 2 was 1000° C. which was low.

As described above, Example enables fabrication of the wafer which has no slip dislocation, the BMDs highly densely formed therein, and the excellent TDDB characteristic.

It is to be noted that the present invention is not restricted to the foregoing embodiment. The foregoing embodiment is an illustrative example, and any example which has substantially the same configuration and exerts the same functions and effects as the technical concept described in claims of the present invention is included in the technical scope of the present invention.

The invention claimed is:

1. A method for manufacturing a silicon wafer which has a denuded zone in a surface layer by performing a heat treatment to a silicon wafer to be treated, the method comprising:
    a step A of performing a first rapid heat treatment of 0.01 msec or more and 100 msec or less to an upper surface layer alone of the silicon wafer to be treated at a temperature of 1300° C. or more and a silicon melting point or less by using a first heat source which heats the silicon wafer to be treated from above; and
    a step B of holding the silicon wafer to be treated at a temperature which is 1100° C. or more and less than 1300° C. for one second or more and 100 seconds or less by a second rapid heat treatment using a second heat source which heats the silicon wafer to be heated, and decreasing the temperature at a temperature falling rate of 30° C./sec or more and 150° C./sec or less,
    wherein the step A is performed during the step B, and the silicon wafer to be treated is heated from below by the second heat source in the step B.

2. The method for manufacturing a silicon wafer according to claim 1, wherein a xenon lamp is used as the first heat source.

3. The method for manufacturing a silicon wafer according to claim 1, wherein a halogen lamp is used as the second heat source.

4. The method for manufacturing a silicon wafer according to claim 1, wherein the silicon wafer to be treated is sliced out from a silicon single crystal ingot which is grown by a Czochralski method and has oxygen concentration of 7 ppma or more and 20 ppma or less.

5. The method for manufacturing a silicon wafer according to claim 1, wherein the silicon wafer to be treated is sliced out from a silicon single crystal ingot which is grown by a Czochralski method and has nitrogen concentration of $1\times10^{11}$ to $1\times10^{15}$ atoms/cm$^3$.

6. The method for manufacturing a silicon wafer according to claim 1, wherein the silicon wafer to be treated is sliced out from a silicon single crystal ingot which is grown by a Czochralski method and has carbon concentration of $1\times10^{16}$ to $1\times10^{17}$ atoms/cm$^3$.

7. The method for manufacturing a silicon wafer according to claim 1, wherein the silicon wafer to be treated is sliced out from a silicon single crystal ingot which is grown by a Czochralski method and whose entire plane in a radial direction is an N region.

* * * * *